US012706167B2

(12) United States Patent
Zhang et al.

(10) Patent No.: US 12,706,167 B2
(45) Date of Patent: Aug. 11, 2026

(54) ENHANCING READ WINDOW BUDGET USING READ VERIFY

(71) Applicant: Micron Technology, Inc., Boise, ID (US)

(72) Inventors: Daniel Zhang, Milpitas, CA (US); Yu-Chung Lien, San Jose, CA (US); Peng Zhang, Los Altos, CA (US); Murong Lang, San Jose, CA (US); Zhenming Zhou, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 206 days.

(21) Appl. No.: 18/774,642

(22) Filed: Jul. 16, 2024

(65) Prior Publication Data

US 2025/0069675 A1 Feb. 27, 2025

Related U.S. Application Data

(60) Provisional application No. 63/534,707, filed on Aug. 25, 2023.

(51) Int. Cl.

| | |
|---|---|
| ***G11C 16/34*** | (2006.01) |
| ***G11C 16/10*** | (2006.01) |
| ***G11C 16/26*** | (2006.01) |
| ***G11C 16/32*** | (2006.01) |

(52) U.S. Cl.
CPC ........ *G11C 16/3459* (2013.01); *G11C 16/102* (2013.01); *G11C 16/26* (2013.01); *G11C 16/32* (2013.01)

(58) Field of Classification Search
CPC ... G11C 16/3459; G11C 16/102; G11C 16/26; G11C 16/32
See application file for complete search history.

(56) References Cited

U.S. PATENT DOCUMENTS

2020/0133754 A1* 4/2020 Sheperek ............ G06F 11/0727
2020/0185034 A1* 6/2020 Liikanen ................ G11C 16/10
2023/0195559 A1* 6/2023 Hartz .................. G11C 16/349 714/47.2
2023/0197137 A1* 6/2023 Hartz .................. G11C 16/349 365/222
2023/0395161 A1* 12/2023 Kaynak ............. G11C 16/3459

(Continued)

*Primary Examiner* — Amir Zarabian
*Assistant Examiner* — Justin Bryce Heisterkamp
(74) *Attorney, Agent, or Firm* — Schwegman Lundberg & Woessner, P.A.

(57) ABSTRACT

The disclosure configures a memory sub-system controller to use prior read verify operations to selectively apply enhancements to read window budgets (RWB). The controller receives a request to perform a memory operation on data stored in an individual memory component of a set of memory components. The controller accesses RWB tracking information associated with the individual memory component and determines that the tracking information associated with the individual memory component indicates a need for enhancing a RWB associated with the memory operation. The controller applies one or more enhancement processes to the individual memory component in response to determining that the tracking information associated with the individual memory component indicates the need for enhancing the RWB associated with the memory operation.

20 Claims, 5 Drawing Sheets

(56) References Cited

U.S. PATENT DOCUMENTS

2024/0055046 A1* 2/2024 Rayaprolu ........... G11C 29/028
2024/0055061 A1* 2/2024 Kaynak ............... G11C 11/5628
2024/0071522 A1* 2/2024 Ciocchini .............. G11C 16/08
2024/0152279 A1* 5/2024 Tseng ..................... G11C 16/10

* cited by examiner

ENHANCING READ WINDOW BUDGET USING READ VERIFY

PRIORITY APPLICATION

This application claims the benefit of priority to U.S. Provisional Application Ser. No. 63/534,707, filed Aug. 25, 2023, which is incorporated herein by reference in its entirety.

TECHNICAL FIELD

Examples of the disclosure relate generally to memory sub-systems and, more specifically, to providing adaptive media management for memory components, such as memory dies.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data on the memory components and to retrieve data from the memory components.

BRIEF DESCRIPTION OF THE DRAWINGS

The present disclosure will be understood more fully from the detailed description given below and from the accompanying drawings of various examples of the disclosure.

DETAILED DESCRIPTION

Figure 1:
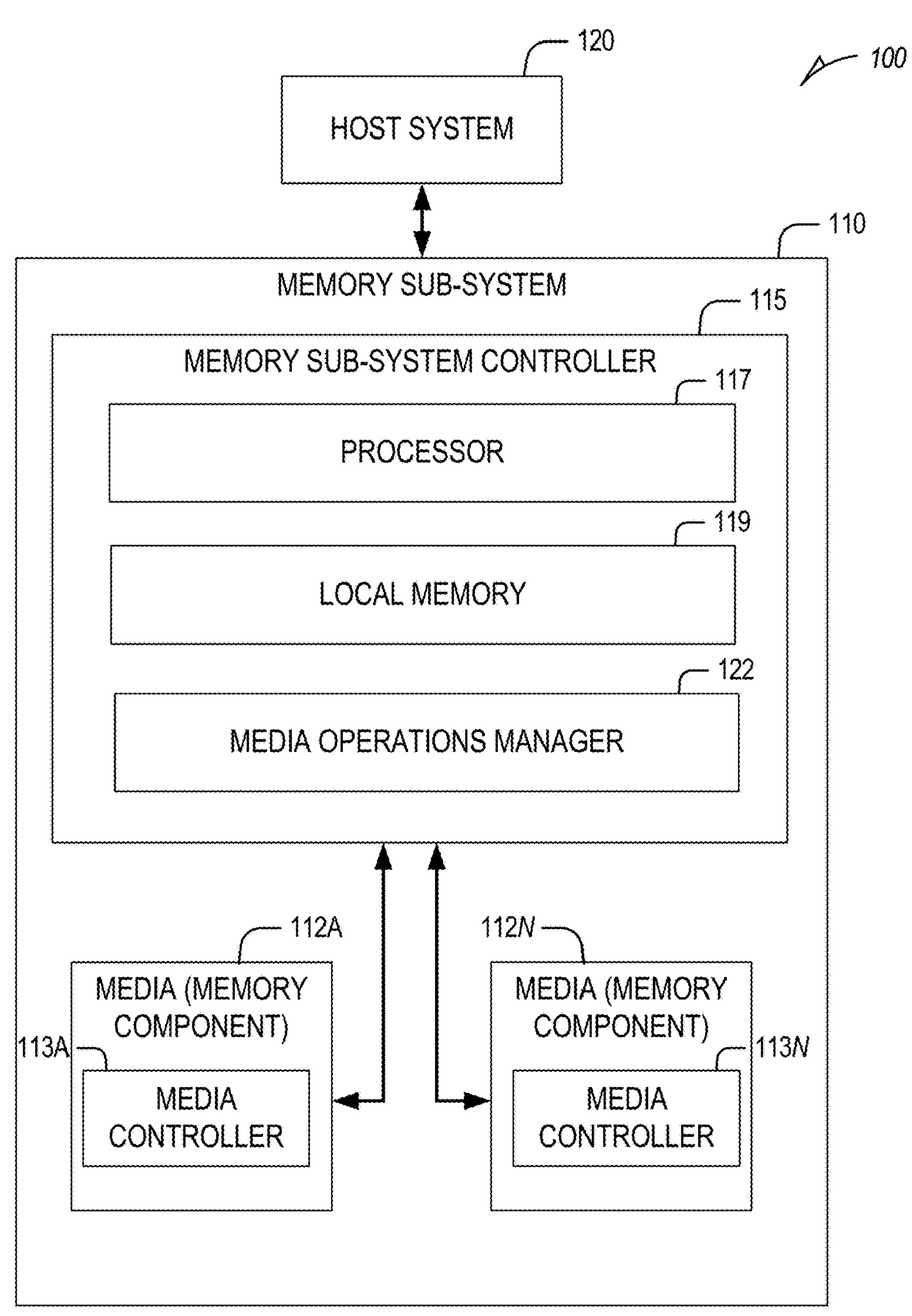
FIG. 1 is a block diagram illustrating an example computing environment including a memory sub-system, in accordance with some examples of the present disclosure.

Examples of the present disclosure configure a system component, such as a memory sub-system controller, to selectively perform RWB enhancement based on prior or historical memory operations performed on an individual memory component. The controller can program or write data to the individual memory component and can generate tracking information indicating whether a read verify operation performed for the written data indicates that RWB enhancement may be needed. The controller can then perform subsequent memory operations (e.g., read or write operations) on the individual memory component based on the tracking information. Specifically, the controller can apply one or more enhancement operations to the data written on the memory component prior to performing a requested memory operation to improve the RWB. The one or more enhancement operations can include step static operations, quad level cell (QLC) double fine operations, modifying one or more trim levels, adjusting a program time, changing a location of a memory voltage to improve margin and cycling degradation, adjusting a read threshold voltage, and/or program/read sense management. In this way, the controller can improve the storage and retrieval of data from the memory components and reduce errors.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices (e.g., memory dies or planes across multiple memory dies) that store data. The host system can send access requests (e.g., write command, read command) to the memory sub-system, such as to store data at the memory sub-system and to read data from the memory sub-system. The data (or set of data) specified by the host is hereinafter referred to as "host data," "application data," or "user data."

The storage devices can use a calibration mechanism to dynamically calibrate the programming step, such as the incremental amounts of charge iteratively stored in a memory cell to reach a desired amount of charge. The storage devices can be configured to dynamically calibrate the programming step while the storage devices are used. To calibrate the programming step, the storage devices can calculate an estimation or a prediction for events associated with error recovery. The estimation, or the prediction, can be based on gathering multiple samples or results, such as data count or error rate, while calibrating various aspects of the storage devices or while the storage devices are used. The storage devices can dynamically calibrate the programming step to leverage RWB and reduce programming time for the memory devices. The RWB represents a separation between a threshold voltage and voltages corresponding to adjacent logic states and can also correspond to a degree of accuracy or tolerance range allowed for writing/programming the data. The storage devices can increase or decrease the programming step according to a representation of the RWB to reduce programming time and/or reduce errors.

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data". "User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

Many different media management operations can be performed on the memory device. For example, the media management operations can include different scan rates, different scan frequencies, different wear leveling, different read disturb management, different near miss error correction (ECC), and/or different dynamic data refresh. Wear leveling ensures that all blocks in a memory component approach their defined erase-cycle budget at the same time, rather than some blocks approaching it earlier. Read disturb management counts all of the read operations to the memory component. If a certain threshold is reached, the surrounding regions are refreshed. Near-miss ECC refreshes all data read by the application that exceeds a configured threshold of errors. Dynamic data-refresh scans read all data and identify the error status of all blocks as a background operation. If a certain threshold of errors per block or ECC unit is exceeded in this scan-read, a refresh operation is triggered.

A memory device can be a non-volatile memory device. A non-volatile memory device is a package of one or more dice (or dies). Each die can be comprised of one or more planes. For some types of non-volatile memory devices (e.g., NAND devices), each plane is comprised of a set of physical blocks. For some memory devices, blocks are the smallest area than can be erased. Such blocks can be referred to or addressed as logical units (LUN). Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which is a raw memory device combined with a local embedded controller for memory management within the same memory device package.

Conventional memory sub-systems trade off program latency for maximizing RWB. Namely, conventional memory sub-systems identify memory locations that are associated with lower reliability metrics. For those memory locations, the memory sub-systems program data at a lower program speed (e.g., increased latency) without considering other factors in order to increase the RWB. Also, other memory locations that may not be known to have low reliability metrics can continue to be programmed at normal program speed which can adversely impact the subsequent retrieval of the data (e.g., can cause increased read errors). Applying a one-size-fits-all approach to performing such memory enhancements is inefficient and may still result in poor RWB and/or read bit error rate (RBER). This can slow down the overall memory sub-system and can prolong performing other operations, which introduces inefficiencies.

Examples of the present disclosure address the above and other deficiencies by providing a memory controller that can selectively apply one or more enhancement processes to memory components that have been previously determined to have performance that fails to satisfy one or more metrics. For example, the controller can store tracking information for the memory components that are generated in response to performing read verify operations after storing data to the memory components. The tracking information can indicate whether manufacturing information indicates the reliability metrics of the memory components as below a threshold and/or that a RBER resulting from the read verify operations transgresses a threshold. In such cases, the controller can apply the one or more enhancement operations or processes to improve performance of one or more subsequent memory operations (e.g., subsequent memory read/write operations). This increases the overall efficiency of operating the memory sub-system.

In some examples, the memory controller receives a request to perform a memory operation on data stored in an individual memory component of the set of memory components. The memory controller accesses RWB tracking information associated with the individual memory component. The memory controller determines that the tracking information associated with the individual memory component indicates a need for enhancing a RWB associated with the memory operation. The memory controller applies one or more enhancement processes to the individual memory component in response to determining that the tracking information associated with the individual memory component indicates the need for enhancing the RWB associated with the memory operation.

In some examples, the memory controller performs the memory operation on the data stored in the individual memory component in response to applying the one or more enhancement processes to the individual memory component. In some cases, the one or more enhancement processes are applied prior to performing the memory operation on the data stored in the individual memory component.

In some examples, the memory operation includes a write request. In such cases, the memory controller programs the data to the individual memory component to which the one or more enhancement processes have been applied. In some cases, the memory operation includes a read request. In such cases, the memory controller reads the data from the individual memory component to which the one or more enhancement processes have been applied.

In some examples, the memory controller generates the tracking information by receiving a request to program the data to the individual memory component. The memory controller programs the data to the individual memory component. The memory controller, after programming the data, performs a read verify operation on the programmed data and computes a RBER associated with the read verify operation for the individual memory component. The memory controller stores the tracking information associated with the individual memory component in response to computing the RBER associated with the read verify operation of the individual memory component. In some cases, the memory controller determines that the RBER transgresses a threshold value and, in response, stores a value, as part of the tracking information, that indicates the need for enhancing the RWB associated with subsequent memory operations performed on the individual memory component.

In some examples, the memory controller determines that the RBER fails to transgress a threshold value. The memory controller, in response to determining that the RBER fails to transgress the threshold value, stores a value, as part of the tracking information, that indicates no need for enhancing the RWB associated with subsequent memory operations performed on the individual memory component. In some cases, the memory controller accesses manufacturing information indicative of performance of the individual memory component. In some examples, the memory controller stores the tracking information associated with the individual memory component in response to computing the RBER and based on the manufacturing information indicative of performance of the individual memory component.

In some examples, the individual memory component includes a memory block, memory die, memory word line, or memory page. In some cases, the one or more enhancement processes include at least one of step static operations, quad level cell (QLC) double fine operations, or program/read sense management. In some cases, the one or more enhancement processes include modifying one or more trim levels for the individual memory component. In some cases, the one or more enhancement processes include adjusting a program time for the individual memory component. In some cases, the one or more enhancement processes include changing a location of a memory voltage to improve margin and cycling degradation for the individual memory component. In some cases, the one or more enhancement processes include adjusting a read threshold voltage associated with reading data from the individual memory component.

Though various examples are described herein as being implemented with respect to a memory sub-system (e.g., a controller of the memory sub-system), some or all of the portions of an example can be implemented with respect to a host system, such as a software application or an operating system of the host system.

FIG. 1 illustrates an example computing environment 100 including a memory sub-system 110, in accordance with some examples of the present disclosure. The memory sub-system 110 can include media, such as memory components 112A to 112N (also hereinafter referred to as “memory devices”). The memory components 112A to 112N can be volatile memory devices, non-volatile memory devices, or a combination of such. The memory components 112A to 112N can be implemented by individual dies, such that a first memory component 112A can be implemented by a first memory die (or a first collection of memory dies) and a second memory component 112N can be implemented by a second memory die (or a second collection of memory dies). Each memory die can include a plurality of planes in which data can be stored or programmed. In some cases, the first memory component 112A can be implemented by a first SSD (or a first independently operable memory sub-system) and the second memory component 112N can be implemented by a second SSD (or a second independently operable memory sub-system).

In some examples, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some examples, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, “coupled to” generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a compute express link (CXL), a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe or CXL interface. The physical host interface can provide an interface for passing control, address, data, and other signals between the memory sub-system 110 and the host system 120.

The memory components 112A to 112N can include any combination of the different types of non-volatile memory components and/or volatile memory components and/or storage devices. An example of non-volatile memory components include a negative-and (NAND)-type flash memory. Each of the memory components 112A to 112N can include one or more arrays of memory cells such as single-level cells (SLCs) or multi-level cells (MLCs) (e.g., TLCs or QLCs). In some examples, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory. In some examples, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells.

A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or blocks that can refer to a unit of the memory component 112 used to store data. For example, a single first row that spans a first set of the pages or blocks of the memory components 112A to 112N can correspond to or be grouped as a first block stripe and a single second row that spans a second set of the pages or blocks of the memory components 112A to 112N can correspond to or be grouped as a second block stripe.

The memory sub-system controller 115 can communicate with the memory components 112A to 112N to perform memory operations such as reading data, writing data, or erasing data at the memory components 112A to 112N and other such operations. The memory sub-system controller 115 can communicate with the memory components 112A to 112N to perform various memory management operations, such as enhancement operations, different scan rates, different scan frequencies, different wear leveling, different read disturb management, garbage collection operations, different near miss ECC operations, and/or different dynamic data refresh.

The memory sub-system controller 115 can include hardware, such as one or more integrated circuits and/or discrete components, a buffer memory, or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some examples, the local memory 119 can include memory registers storing memory pointers, fetched data, and so forth. The local memory 119 can also include read-only memory (ROM) for storing microcode. While the example memory sub-system 110 in FIG. 1 has been illustrated as including the memory sub-system controller 115, in another example of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. In some examples, the commands or operations received from the host system 120 can specify configuration data for the memory components 112A to 112N. The configuration data can describe the lifetime (maximum) PEC values and/or reliability grades associated with different groups of the memory components 112A to 112N and/or different blocks within each of the memory components 112A to 112N. The configuration data can also include various manufacturing information for individual memory components of the memory components 112A to 112N. The manufacturing information can specify the reliability metrics/information associated with each memory component. The configuration data can also store tracking information for each memory component. The tracking information can be generated in response to performing read verify operations on individual memory components. The tracking information can indicate whether there is or there is no need to perform enhancement operations on individual memory components to improve the RWB of the individual memory components prior to performing a requested memory operation.

In some examples, the commands or operations received from the host system 120 can include a write/read command, which can specify or identify an individual memory component in which to program/read data. Based on the memory component specified by the write/read command, the memory sub-system controller 115 can program/read the data into/from one or more of the memory components 112A to 112N. The memory sub-system controller 115 can be responsible for other memory management operations, such as wear leveling operations, garbage collection operations, error detection and error-correcting code (ECC) operations, encryption operations, caching operations, and address translations. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some examples, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which are raw memory devices combined with a local embedded controller (e.g., local media controllers) for memory management within the same memory device package. Any one of the memory components 112A to 112N can include a media controller (e.g., media controller 113A and media controller 113N) to manage the memory cells of the memory component (e.g., to perform one or more memory management operations), to communicate with the memory sub-system controller 115, and to execute memory requests (e.g., read or write) received from the memory sub-system controller 115.

The memory sub-system controller 115 can include a media operations manager 122. The media operations manager 122 can be configured to perform RWB enhancement operations based on tracking information indicating a need or no need (lack of a need) for RWB enhancement. Prior to performing a requested memory operation on an individual memory component, the memory sub-system controller 115 can query the configuration data to obtain tracking information for the individual memory component. The memory sub-system controller 115 can determine that the tracking information indicates a need to perform RWB enhancement. In response, the memory sub-system controller 115 can perform one or more RWB enhancement operations prior to performing the requested operation. This improves data retention and/or reduces read errors associated with performing the requested operations which increases the overall efficiency of operating the memory sub-system 110.

Depending on the example, the media operations manager 122 can comprise logic (e.g., a set of transitory or non-transitory machine instructions, such as firmware) or one or more components that causes the media operations manager 122 to perform operations described herein. The media operations manager 122 can comprise a tangible or non-tangible unit capable of performing operations described herein. Further details with regards to the operations of the media operations manager 122 are described below.

Figure 2:
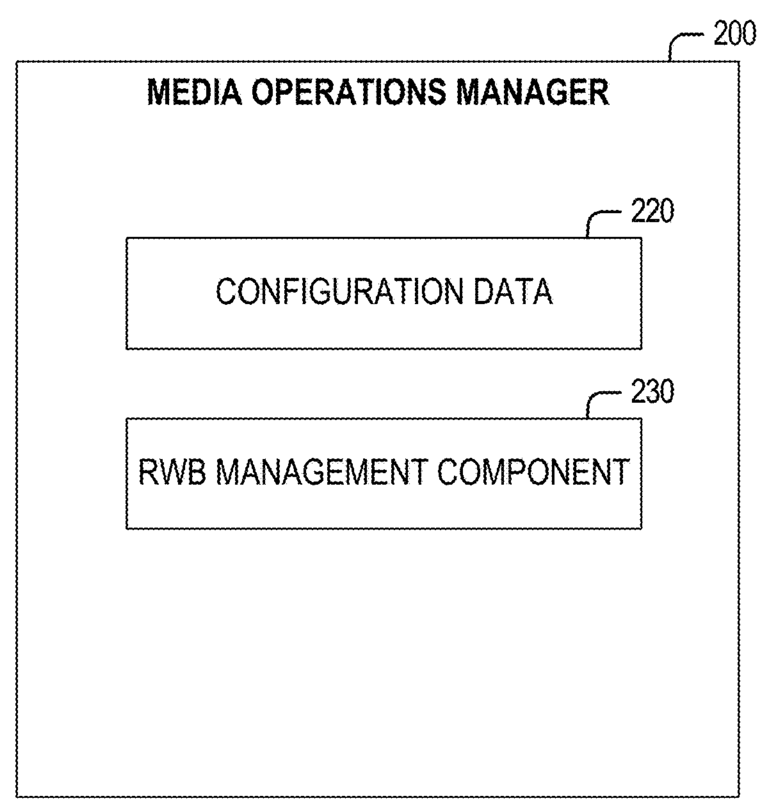
FIG. 2 is a block diagram of an example media operations manager, in accordance with some implementations of the present disclosure.

FIG. 2 is a block diagram of an example media operations manager 200 (corresponding to media operations manager 122 of FIG. 1), in accordance with some implementations of the present disclosure. As illustrated, the media operations manager 200 includes configuration data 220 and a RWB management component 230. For some examples, the media operations manager 200 can differ in components or arrangement (e.g., less or more components) from what is illustrated in FIG. 2.

The configuration data 220 accesses and/or stores configuration data associated with the memory components 112A to 112N of FIG. 1. In some examples, the configuration data 220 is programmed into the media operations manager 200. For example, the media operations manager 200 can communicate with the memory components 112A to 112N to obtain the configuration data and store the configuration data 220 locally on the media operations manager 122. In some examples, the media operations manager 122 communicates with the host system 120 of FIG. 1. The host system 120 receives input from an operator or user that specifies parameters including virtual memory group assignments to physical memory components, lifetime (maximum) PEC values of different bins, groups, blocks, block stripes, memory dies, manufacturing information, tracking information (indicating a need to perform RWB enhancement operations prior to performing a requested memory operation), and/or reliability information.

The media operations manager 122 can receive configuration data from the host system 120 and store the configuration data in the configuration data 220. The media operations manager 122 can update the configuration data for various memory components over time, such as based on results associated with read verify operations.

In some examples, the RWB management component 230 can communicate with the configuration data 220 to obtain tracking information for an individual memory component of the memory components 112A to 112N. For example, the RWB management component 230 can receive a request to perform a memory operation from the host system 120 on the individual memory component. The RWB management component 230 can access the configuration information to determine whether tracking information is available for the individual memory component.

In some examples, the RWB management component 230 determines that there is no tracking information stored for the individual memory component. In such cases, the RWB management component 230 can perform the requested operation without performing RWB enhancement operations. For example, the RWB management component 230 can determine that the requested operation is a memory write operation. In such cases, the RWB management component 230 can program data into the individual memory component. After programming the data, the RWB management component 230 can perform a read verify operation. Namely, the RWB management component 230 can read the data from the individual memory component into which the data was just programmed.

The RWB management component 230 can compute a reliability metric for the read data based on the read verify operation. For example, the RWB management component 230 can obtain or compute a RBER associated with reading data in response to the read verify operation. The RWB management component 230 can access the configuration data 220 to obtain manufacturing information for the individual memory component which can indicate the reliability metric for the individual memory component. Based on the RBER and/or the manufacturing information, the RWB management component 230 can store tracking information for the data programmed into the individual memory component. For example, the RWB management component 230 can determine that the RBER is below a threshold value (fails to transgress the threshold value). In such cases, the RWB management component 230 can store, in the tracking information, data specifying that RWB enhancement operations are not needed to be performed prior to performing one or more subsequent memory operations on the individual memory component. As another example, the RWB management component 230 can determine that the RBER is above a threshold value (transgresses the threshold value). In such cases, the RWB management component 230 can store, in the tracking information, data specifying that RWB enhancement operations are needed to be performed prior to performing one or more subsequent memory operations on the individual memory component.

For example, the RWB management component 230 can determine that the reliability metric for the individual memory component is below a threshold value (fails to transgress the threshold value). In such cases, the RWB management component 230 can store, in the tracking information, data specifying that RWB enhancement operations are needed to be performed prior to performing one or more subsequent memory operations on the individual memory component. As another example, the RWB management component 230 can determine that the reliability metric for the individual memory component is above the threshold value (transgresses the threshold value). In such cases, the RWB management component 230 can store, in the tracking information, data specifying that RWB enhancement operations are not needed to be performed prior to performing one or more subsequent memory operations on the individual memory component.

In some examples, the RWB management component 230 can receive a request, from the host system 120, to perform a read/write operation on the data stored to the individual memory component (e.g., after the tracking information is stored/generated). In such cases, the RWB management component 230 can access the configuration data 220 to obtain the tracking information for the individual memory component. The RWB management component 230 can determine that the tracking information indicates there is a need to perform RWB enhancement operations on the individual memory component. In such cases, the RWB management component 230 can perform one or more enhancement operations on the individual memory component prior to performing the requested read/write operation.

For example, the request can specify a command to read a portion of the individual memory component. In such cases, the RWB management component 230 can adjust read threshold voltage levels associated with the portion of the individual memory component as the one or more enhancement operations. After adjusting the read threshold voltage levels, the RWB management component 230 can perform the requested command to read the data from the portion and return the result to the host system 120. If the tracking information indicates there is no need to perform enhancement operations (e.g., RWB enhancement operations), the RWB management component 230 can execute or perform the command to read the data from the portion of the individual memory component without first performing the RWB enhancement operations. The one or more enhancement processes can include at least one of step static operations, quad level cell (QLC) double fine operations, and/or program/read sense management.

For example, the request can specify a command to write data to a portion of the individual memory component. In such cases, the RWB management component 230 can reduce the write speed, program time, and/or or modify the trim levels associated with the portion of the individual memory component as the one or more enhancement operations. After performing the one or more enhancement operations, the RWB management component 230 can perform the requested command to program/write the data to the portion. If the tracking information indicates there is no need to perform enhancement operations (e.g., RWB enhancement operations), the RWB management component 230 can execute or perform the command to write the data to the portion of the individual memory component without first performing the RWB enhancement operations. After executing the command to write the data, the RWB management component 230 can perform a read verify operation on the written data. The RWB management component 230 can compute a reliability metric on the read data based on the read verify operation and update the tracking information stored for the individual memory component based on the reliability metric.

Figure 3:
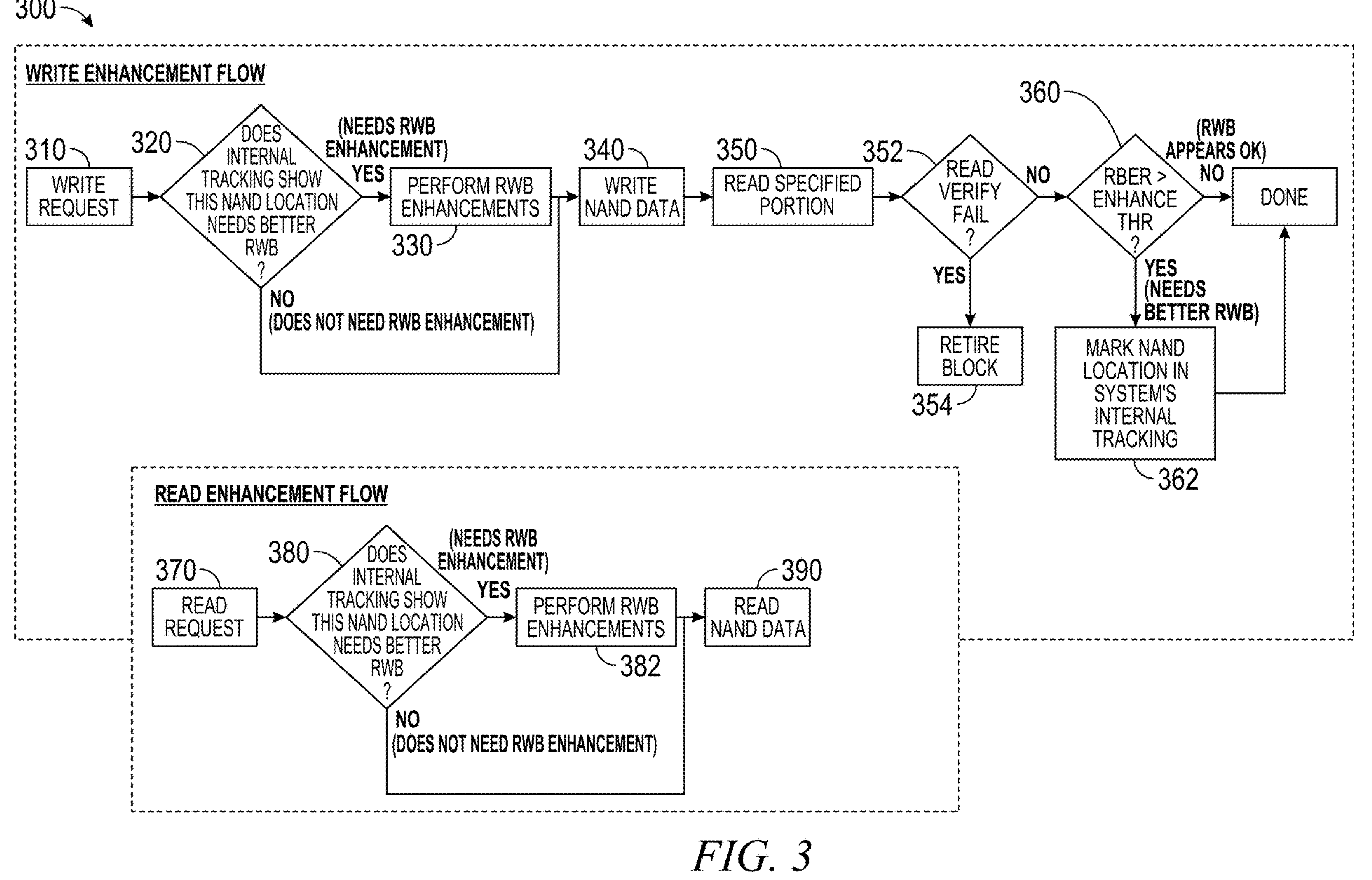
FIGS. 3 and 4 are flow diagrams of example methods of processes for a memory controller to perform read window budget (RWB) enhancement operations based on tracking information, in accordance with some implementations of the present disclosure.

FIG. 3 is a flow diagram of an example method 300 to allow a memory controller to perform RWB enhancement operations based on tracking information, in accordance with some implementations of the present disclosure. The method 300 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some examples, the method 300 is performed by the media operations manager 122 of FIG. 1. Although the processes are shown in a particular sequence or order, unless otherwise specified, the order of the processes can be modified. Thus, the illustrated examples should be understood only as examples, and the illustrated processes can be performed in a different order, and some processes can be performed in parallel. Additionally, one or more processes can be omitted in various examples. Thus, not all processes are required in every example. Other process flows are possible.

Referring now to FIG. 3, the method (or process) 300 begins at operations 310 or 370. Namely, at operation 310, the media operations manager 200 receives a request to write data to an individual memory component. In response, the media operations manager 200 of FIG. 2 performs operation 320 where tracking information for the individual memory component is accessed to determine whether the individual memory component (or portion of the individual memory component) needs better RWB (e.g., needs RWB enhancement operations). The media operations manager 200 can determine that there exists a need to perform RWB enhancements on the individual memory component (or portion of the individual memory component) based on the tracking information and, at operation 330, the media operations manager 200 performs one or more RWB enhancement operations. In some cases, the media operations manager 200 can determine there does not exist a need to perform RWB enhancements and, in such cases, the media operations manager 200 performs operation 340 to write/program the data to the individual memory component (or portion of the individual memory component).

At operation 350, the media operations manager 200 reads a specified page/portion of the individual memory component to which the data was programmed at operation 340. The media operations manager 200, at operation 352, performs a read verify operation to determine whether the data was successfully read. If the data read failed, the media operations manager 200 performs operation 354 where the portion of the individual memory component is retired and marked for preventing future writes to the individual memory component. In response to performing the operation 352, the media operations manager 200 performs operation 360 to determine whether an RBER associated with the data transgresses a threshold.

The media operations manager 200 can determine that the RBER associated with the data just stored to the individual memory component transgresses the threshold and, in response, performs operation 362. At operation 362, the media operations manager 200 marks or updates tracking information associated with the individual memory component to indicate there is a need to perform RWB enhancement operations for subsequent memory operations. Then, when a subsequent request to perform a read/write operation on the individual memory operation is received, the media operations manager 200 can perform the one or more RWB enhancement operations at operation 330 prior to executing a command to read/write the data.

For example, the media operations manager 200 can receive, at operation 370, a request to read data from the individual memory component. In response, the media operations manager 200 accesses configuration data to obtain tracking information for the individual memory component at operation 380. The media operations manager 200 can determine that the tracking information indicates there is a need to perform RWB enhancement operations prior to performing the read operation. In such cases, the media operations manager 200, at operation 382, performs one or more RWB enhancement operations on the data stored in the individual memory component. Then, at operation 390, the media operations manager 200 reads the data from the individual memory component. If the tracking information indicates there is no need to perform RWB enhancement operations, the media operations manager 200 skips over operation 382 and performs operation 390 to read the data from the individual memory component.

Figure 4:
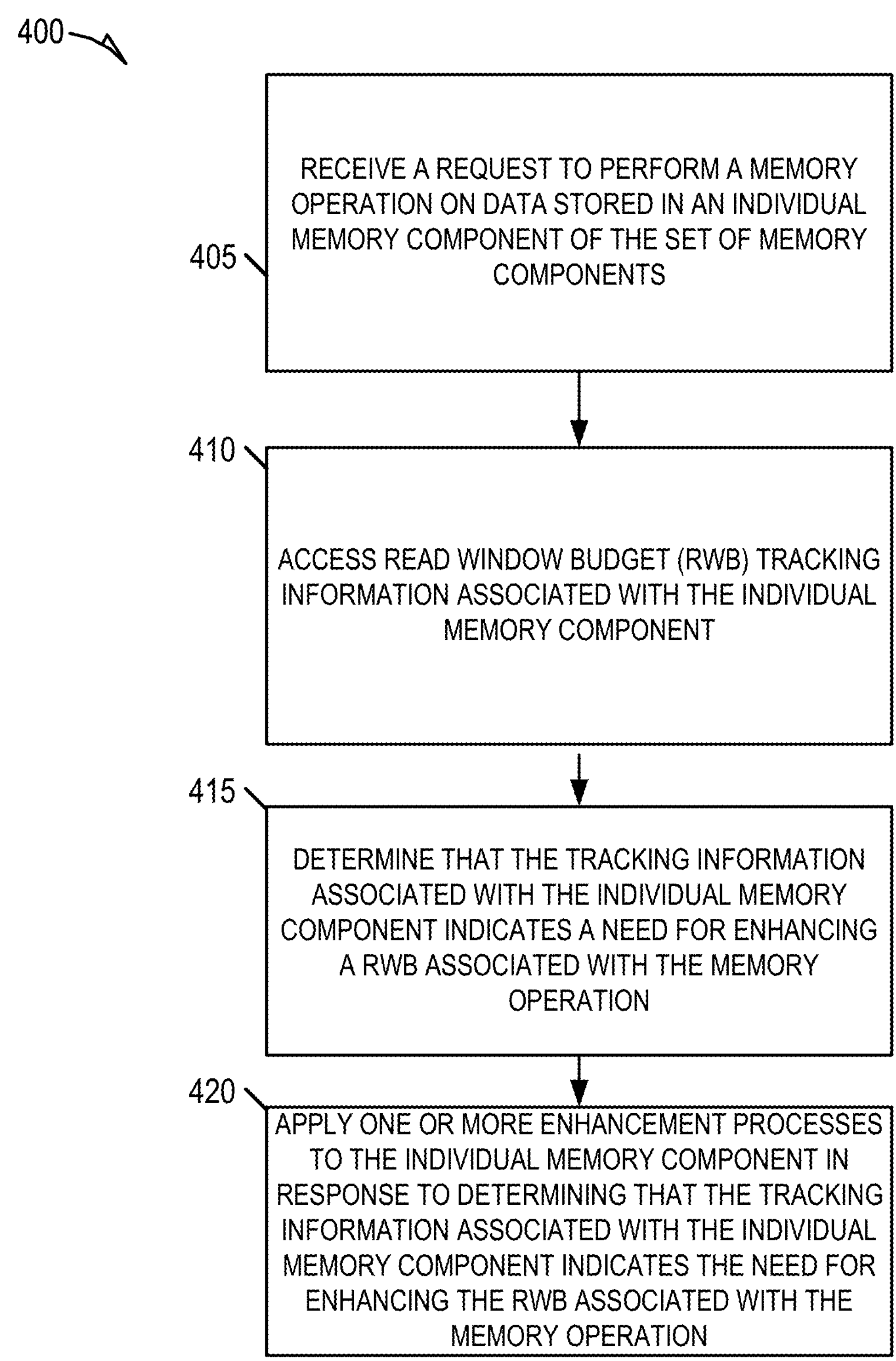

FIG. 4 is a flow diagram of an example method 400 to allow a memory controller to perform RWB enhancement operations based on tracking information, in accordance with some implementations of the present disclosure. The method 400 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some examples, the method 400 is performed by the media operations manager 122 of FIG. 1. Although the processes are shown in a particular sequence or order, unless otherwise specified, the order of the processes can be modified. Thus, the illustrated examples should be understood only as examples, and the illustrated processes can be performed in a different order, and some processes can be performed in parallel. Additionally, one or more processes can be omitted in various examples. Thus, not all processes are required in every example. Other process flows are possible.

Referring now to FIG. 4, the method (or process) 400 begins at operation 405, with a media operations manager 122 of a memory sub-system (e.g., memory sub-system 110) receiving a request to perform a memory operation on data stored in an individual memory component of the set of memory components. Then, at operation 410, the media operations manager 122 accesses read window budget (RWB) tracking information associated with the individual memory component and, at operation 415, determines that the tracking information associated with the individual memory component indicates a need for enhancing a RWB associated with the memory operation. At operation 420, the media operations manager 122 applies one or more enhancement processes to the individual memory component in response to determining that the tracking information associated with the individual memory component indicates the need for enhancing the RWB associated with the memory operation.

In view of the disclosure above, various examples are set forth below. It should be noted that one or more features of an example, taken in isolation or combination, should be considered within the disclosure of this application.

Example 1: A system comprising: a set of memory components of a memory sub-system; and at least one processing device operatively coupled to the set of memory components, the at least one processing device being configured to perform operations comprising: receiving a request to perform a memory operation on data stored in an individual memory component of the set of memory components; accessing read window budget (RWB) tracking information associated with the individual memory component; determining that the tracking information associated with the individual memory component indicates a need for enhancing a RWB associated with the memory operation; and applying one or more enhancement processes to the individual memory component in response to determining that the tracking information associated with the individual memory component indicates the need for enhancing the RWB associated with the memory operation.

Example 2. The system of Example 1, the operations comprising: performing the memory operation on the data stored in the individual memory component in response to applying the one or more enhancement processes to the individual memory component.

Example 3. The system of any one of Examples 1-2, wherein the one or more enhancement processes are applied prior to performing the memory operation on the data stored in the individual memory component.

Example 4. The system of any one of Examples 1-3, wherein the memory operation comprises a write request, the operations comprising: programming the data to the individual memory component to which the one or more enhancement processes have been applied.

Example 5. The system of any one of Examples 1-4, wherein the memory operation comprises a read request, the operations comprising: reading the data from the individual memory component to which the one or more enhancement processes have been applied.

Example 6. The system of any one of Examples 1-5, the operations comprising generating the tracking information by: receiving a request to program the data to the individual memory component; programming the data to the individual memory component; after programming the data, performing a read verify operation on the programmed data; computing a read bit error rate (RBER) associated with the read verify operation for the individual memory component; and storing the tracking information associated with the individual memory component in response to computing the RBER associated with the read verify operation of the individual memory component.

Example 7. The system of Example 6, the operations comprising: determining that the RBER transgresses a threshold value; and in response to determining that the RBER transgresses the threshold value, storing a value, as part of the tracking information, that indicates the need for enhancing the RWB associated with subsequent memory operations performed on the individual memory component.

Example 8. The system of any one of Examples 6-7, the operations comprising: determining that the RBER fails to transgress a threshold value; and in response to determining that the RBER fails to transgress the threshold value, storing a value, as part of the tracking information, that indicates no need for enhancing the RWB associated with subsequent memory operations performed on the individual memory component.

Example 9. The system of any one of Examples 6-8, the operations comprising: accessing manufacturing information indicative of performance of the individual memory component.

Example 10. The system of Example 9, the operations comprising: storing the tracking information associated with the individual memory component in response to computing the RBER and based on the manufacturing information indicative of performance of the individual memory component.

Example 11. The system of any one of Examples 1-10, wherein the individual memory component comprises a memory block, memory die, memory word line, or memory page.

Example 12. The system of any one of Examples 1-11, wherein the one or more enhancement processes comprise at least one of step static operations, quad level cell (QLC) double fine operations, or program/read sense management.

Example 13. The system of clause 1, wherein the one or more enhancement processes comprise modifying one or more trim levels for the individual memory component.

Example 14. The system of any one of Examples 1-13, wherein the one or more enhancement processes comprise adjusting a program time for the individual memory component.

Example 15. The system of any one of Examples 1-14, wherein the one or more enhancement processes comprise changing a location of a memory voltage to improve margin and cycling degradation for the individual memory component.

Example 16. The system of any one of Examples 1-15, wherein the one or more enhancement processes comprise adjusting a read threshold voltage associated with reading data from the individual memory component.

Methods and computer-readable storage medium with instructions for performing any one of the above Examples.

Figure 5:
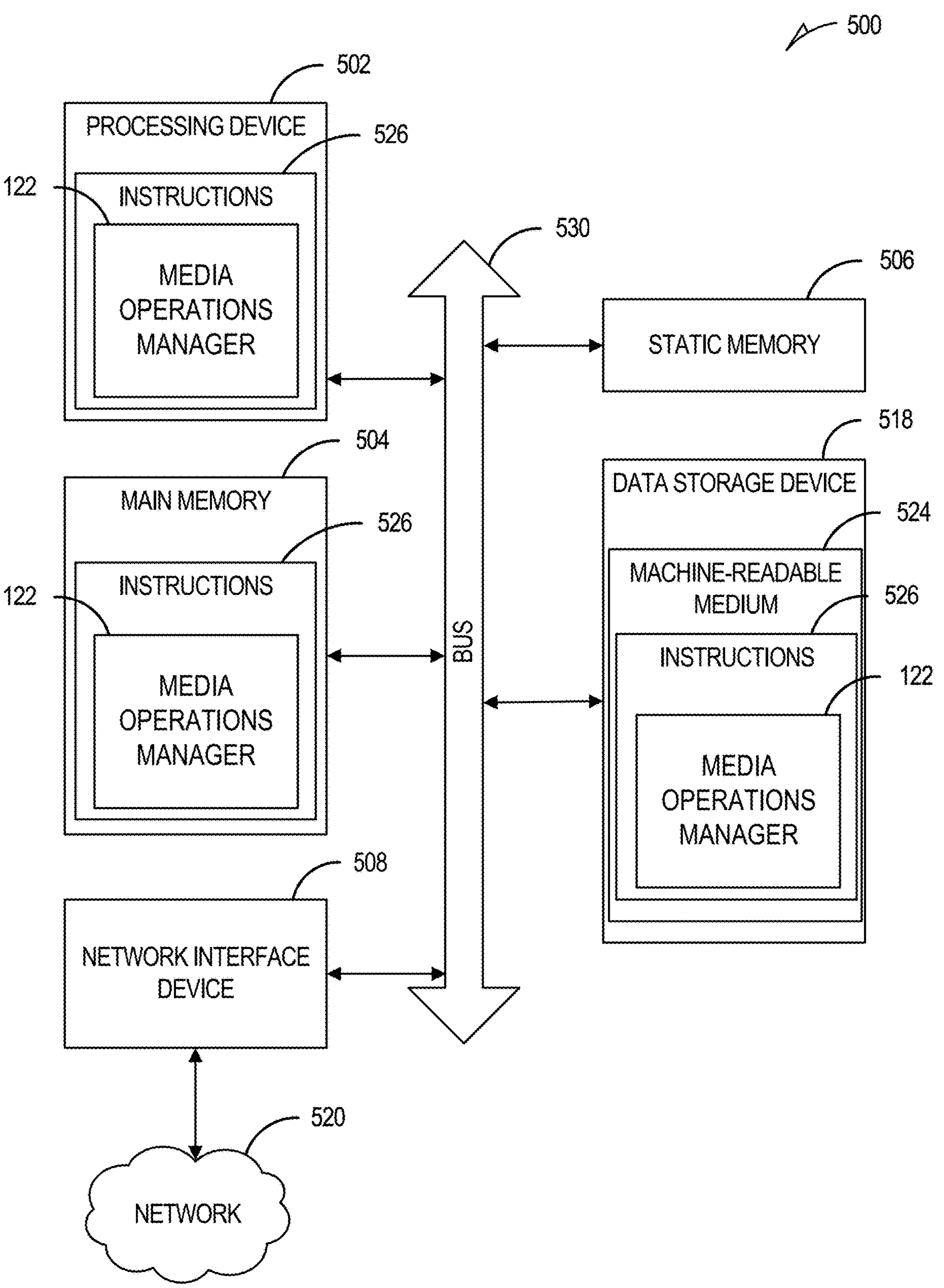
FIG. 5 is a block diagram illustrating a diagrammatic representation of a machine in the form of a computer system within which a set of instructions can be executed for causing the machine to perform any one or more of the methodologies discussed herein, in accordance with some examples of the present disclosure.

FIG. 5 illustrates an example machine in the form of a computer system 500 within which a set of instructions can be executed for causing the machine to perform any one or more of the methodologies discussed herein. In some examples, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media operations manager 122 of FIG. 1). In alternative examples, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device 502 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), a network processor, or the like. The processing device 502 is configured to execute instructions 526 for performing the operations and steps discussed herein. The computer system 500 can further include a network interface device 508 to communicate over a network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one example, the instructions 526 implement functionality corresponding to the media operations manager 122 of FIG. 1. While the machine-readable storage medium 524 is shown in an example to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work most effectively to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some examples, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, the disclosure has been described with reference to specific examples thereof. It will be evident that various modifications can be made thereto without departing from the broader scope of the disclosure as set forth in the following claims. The specification and drawings are, accordingly, to be regarded in an illustrative sense rather than a restrictive sense.

What is claimed is:

1. A system comprising:

a set of memory components of a memory sub-system; and at least one processing device operatively coupled to the set of memory components, the at least one processing device being configured to perform operations comprising:

receiving a request to perform a memory operation on data stored in an individual memory component of the set of memory components;

accessing read window budget (RWB) tracking information associated with the individual memory component;

determining that the tracking information associated with the individual memory component indicates a need for enhancing a RWB associated with the memory operation; and applying one or more enhancement processes to the individual memory component in response to determining that the tracking information associated with the individual memory component indicates the need for enhancing the RWB associated with the memory operation.

2. The system of claim 1, the operations comprising:

performing the memory operation on the data stored in the individual memory component in response to applying the one or more enhancement processes to the individual memory component.

3. The system of claim 1, wherein the one or more enhancement processes are applied prior to performing the memory operation on the data stored in the individual memory component.

4. The system of claim 1, wherein the memory operation comprises a write request, the operations comprising:

programming the data to the individual memory component to which the one or more enhancement processes have been applied.

5. The system of claim 1, wherein the memory operation comprises a read request, the operations comprising:

reading the data from the individual memory component to which the one or more enhancement processes have been applied.

6. The system of claim 1, the operations comprising generating the tracking information by:

receiving a request to program the data to the individual memory component;

programming the data to the individual memory component;

after programming the data, performing a read verify operation on the programmed data;

computing a read bit error rate (RBER) associated with the read verify operation for the individual memory component; and storing the tracking information associated with the individual memory component in response to computing the RBER associated with the read verify operation of the individual memory component.

7. The system of claim 6, the operations comprising:

determining that the RBER transgresses a threshold value; and in response to determining that the RBER transgresses the threshold value, storing a value, as part of the tracking information, that indicates the need for enhancing the RWB associated with subsequent memory operations performed on the individual memory component.

8. The system of claim 6, the operations comprising:

determining that the RBER fails to transgress a threshold value; and in response to determining that the RBER fails to transgress the threshold value, storing a value, as part of the tracking information, that indicates no need for enhancing the RWB associated with subsequent memory operations performed on the individual memory component.

9. The system of claim 6, the operations comprising:

accessing manufacturing information indicative of performance of the individual memory component.

10. The system of claim 9, the operations comprising:

storing the tracking information associated with the individual memory component in response to computing the RBER and based on the manufacturing information indicative of performance of the individual memory component.

11. The system of claim 1, wherein the individual memory component comprises a memory block, memory die, memory word line, or memory page.

12. The system of claim 1, wherein the one or more enhancement processes comprise at least one of step static operations, quad level cell (QLC) double fine operations, or program/read sense management.

13. The system of claim 1, wherein the one or more enhancement processes comprise modifying one or more trim levels for the individual memory component.

14. The system of claim 1, wherein the one or more enhancement processes comprise adjusting a program time for the individual memory component.

15. The system of claim 1, wherein the one or more enhancement processes comprise changing a location of a memory voltage to improve margin and cycling degradation for the individual memory component.

16. The system of claim 1, wherein the one or more enhancement processes comprise adjusting a read threshold voltage associated with reading data from the individual memory component.

17. A method comprising:

receiving a request to perform a memory operation on data stored in an individual memory component of a set of memory components;

accessing read window budget (RWB) tracking information associated with the individual memory component;

determining that the tracking information associated with the individual memory component indicates a need for enhancing a RWB associated with the memory operation; and applying one or more enhancement processes to the individual memory component in response to determining that the tracking information associated with the individual memory component indicates the need for enhancing the RWB associated with the memory operation.

18. The method of claim 17, wherein the one or more enhancement processes comprise at least one of step static operations, quad level cell (QLC) double fine operations, or program/read sense management.

19. The method of claim 17, wherein the one or more enhancement processes comprise adjusting a read threshold voltage associated with reading data from the individual memory component.

20. A non-transitory computer-readable storage medium comprising instructions that, when executed by at least one processing device, cause the at least one processing device to perform operations comprising:

receiving a request to perform a memory operation on data stored in an individual memory component of a set of memory components;

accessing read window budget (RWB) tracking information associated with the individual memory component;

determining that the tracking information associated with the individual memory component indicates a need for enhancing a RWB associated with the memory operation; and applying one or more enhancement processes to the individual memory component in response to determining that the tracking information associated with the individual memory component indicates the need for enhancing the RWB associated with the memory operation.

* * * * *